(12) United States Patent
Shapiro

(10) Patent No.: US 6,626,997 B2
(45) Date of Patent: Sep. 30, 2003

(54) CONTINUOUS PROCESSING CHAMBER

(76) Inventor: Nathan P. Shapiro, 909 Courtland St., Greensboro, NC (US) 27401

( * ) Notice: Subject to any disclaimer, the term of this patent is extended or adjusted under 35 U.S.C. 154(b) by 58 days.

(21) Appl. No.: 09/861,415

(22) Filed: May 17, 2001

(65) Prior Publication Data

US 2002/0170674 A1 Nov. 21, 2002

(51) Int. Cl.[7] .................... H01L 21/305; C23C 16/00
(52) U.S. Cl. .................... 118/715; 118/718; 118/719; 118/729
(58) Field of Search .................... 118/715, 718–731; 427/248.1; 438/680

(56) References Cited

U.S. PATENT DOCUMENTS

| | | | |
|---|---|---|---|
| 2,638,423 A | | 5/1953 | Davis et al. |
| 2,847,330 A | | 8/1958 | Toulmin |
| 3,294,670 A | | 12/1966 | Charschan et al. |
| 3,584,847 A | | 6/1971 | Hammond et al. |
| 3,598,082 A | | 8/1971 | Rice |
| 3,652,444 A | | 3/1972 | Lester et al. |
| 3,672,948 A | | 6/1972 | Foehring et al. |
| 3,750,620 A | | 8/1973 | Eversteijn et al. |
| 5,108,535 A | * | 4/1992 | Ono et al. ............. 156/345.35 |
| 5,108,779 A | | 4/1992 | Gasworth |
| 5,122,391 A | * | 6/1992 | Mayer .................... 427/126.3 |
| 5,846,328 A | | 12/1998 | Aruga et al. |
| 5,863,338 A | | 1/1999 | Yamada et al. |
| 5,938,851 A | * | 8/1999 | Moshtagh .................... 118/715 |
| 6,022,414 A | * | 2/2000 | Miller et al. ................. 118/718 |
| 6,030,460 A | * | 2/2000 | Sukharev ..................... 118/722 |
| 6,056,824 A | * | 5/2000 | Bartholomew et al. ...... 118/719 |

FOREIGN PATENT DOCUMENTS

JP      10059798 A  *  3/1998  ........... C30B/25/12

* cited by examiner

Primary Examiner—Gregory Mills
Assistant Examiner—Ram N Kackar
(74) Attorney, Agent, or Firm—Kolisch Hartwell, P.C.

(57) ABSTRACT

A processing system for processing a wafer with a processing vapor is provided. The processing system comprises a chamber, a wafer holder disposed within the chamber for holding the wafer, a drive mechanism for moving the wafer holder through the chamber, and a processing vapor inlet disposed within the chamber for introducing the processing vapor into the chamber and directing the processing vapor onto the wafer. The processing vapor inlet has a generally elongate cross-section configured to create a flow of processing vapor with a generally elongate cross-section and to direct the flow onto the wafer surface in an orientation generally perpendicular to the wafer surface, thus causing the formation of a generally linear stagnation zone in the flow of the processing vapor where the flow meets the wafer surface. The processing system may include a first outlet positioned toward the front of the chamber and a second outlet positioned toward the back of the chamber.

27 Claims, 6 Drawing Sheets

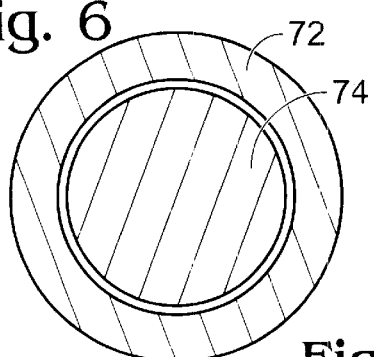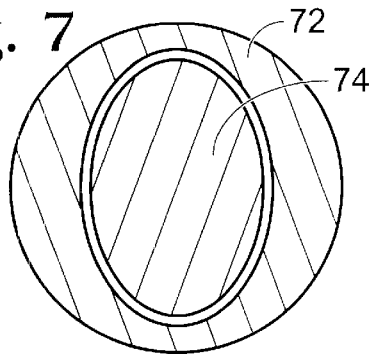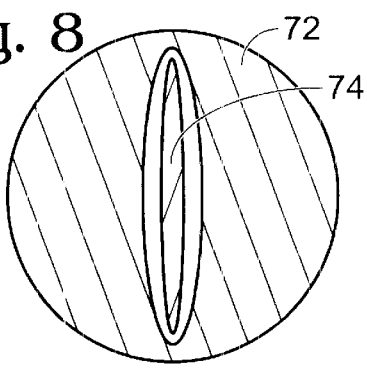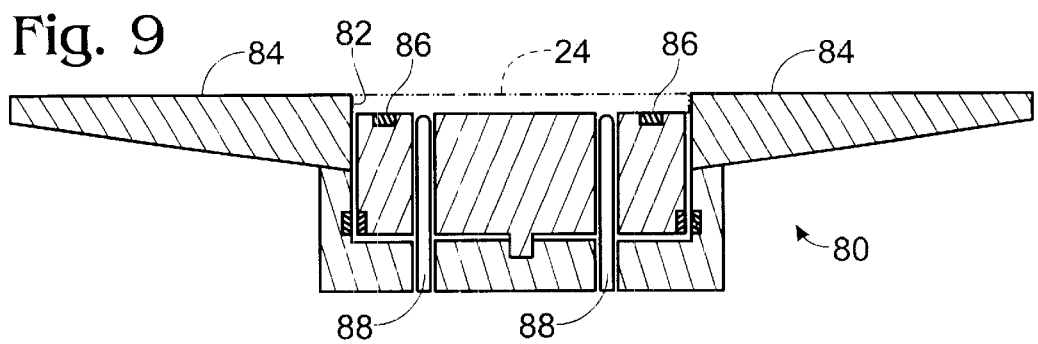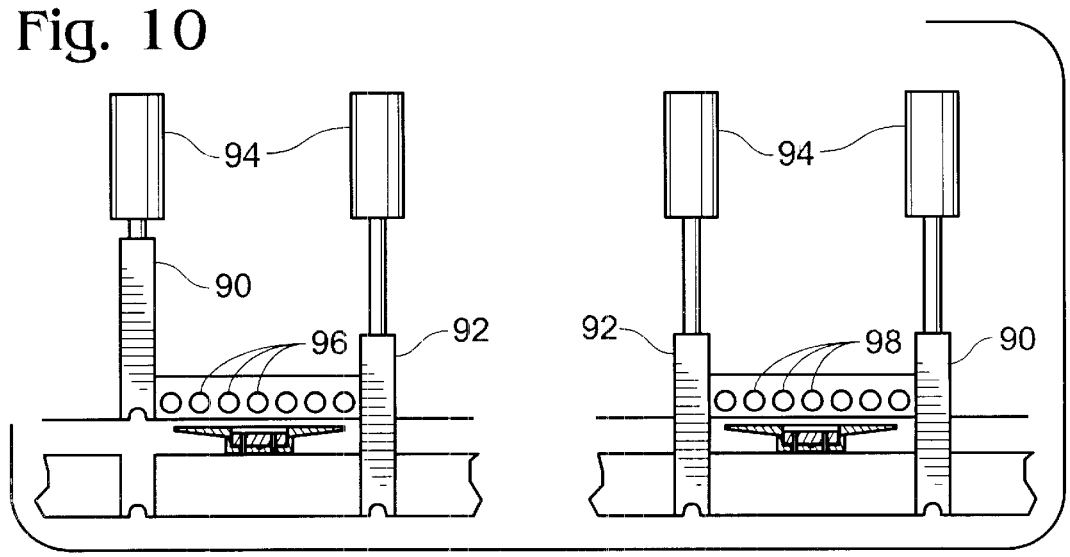

CONTINUOUS PROCESSING CHAMBER

TECHNICAL FIELD

The present invention relates to a chamber for the vapor-phase chemical processing of semiconductor substrates. More particularly, the present invention provides a continuous processing chamber that allows the deposition of highly uniform films with decreased depletion effects.

BACKGROUND OF THE INVENTION

Vapor-phase processing techniques that utilize the flow of a reactive gas through a processing chamber are central to the ability to fabricate integrated circuits on semiconductor substrates. As an example, chemical vapor deposition (CVD) is one of the most important methods of forming films of $SiO_2$, polycrystalline silicon and silicon nitride on silicon substrates. Other vapor-phase processing techniques, such as dry etching, are equally important.

Chemical vapor deposition is the deposition of a non-volatile film on the surface of a substrate by the reaction of vapor phase chemicals that contain the desired constituents of the product film. Many different types of CVD reactors are known, and may have very different designs and performance characteristics relative to one another. For example, two very broad classes of CVD reactors are atmospheric pressure reactors (APCVD) and low-pressure reactors (LPCVD). Found within each of these classes are both batch process systems, in which wafers are processed one batch at a time, and continuous-process systems, in which wafers are continuously fed through a process chamber while the chamber is maintained at process conditions.

Continuous process chambers are generally preferred over batch process chambers for CVD processes, as the continuous-process chambers generally have a higher throughput, especially for APCVD. Many different types of continuous-process reaction chamber designs are known. For example, some chambers are designed to cause the reactant gas mixture to flow parallel to the wafer surfaces as the wafers move through the chamber. In other chamber designs, the reactant gas initially flows generally perpendicular to the wafer surface, and is then exhausted out of an end of the chamber. Various examples of continuous processing chambers are found in U.S. Pat. Nos. 3,598,082, 3,652,444, 3,750,620 and 5,863,338, the disclosures of which are hereby incorporated by reference.

In spite of the large number of continuous-process CVD reactor designs and the mature state of the technology, many reactors, both APCVD and LPCVD, share some common problems. For example, wafers processed in many CVD chambers may suffer depletion effects. Depletion effects are variations in the thickness (or other properties) of a film due to the depletion of reactant gasses in the reactant gas mixture as the mixture flows through the chamber. In the absence of corrective procedures, thinner films tend to grow on wafers positioned toward the end of the gas flow path than on wafers positioned toward the beginning of the gas flow path.

Several techniques currently exist for ameliorating depletion effects in CVD systems. For example, one common technique is the use of a temperature gradient across the length of a CVD reaction chamber to increase the film deposition rate toward the end of the chamber. Another is the use of a tapered chamber shape that narrows toward the end of the gas flow path, causing reactant gasses to flow more quickly across the wafers positioned in this part of the chamber. Furthermore, the wafer carriers may be rotated during their passage through the deposition wafer to lessen edge-to-edge depletion effects. While these techniques lessen the severity of depletion effects, they may still produce wafers with some degree of non-uniformity.

SUMMARY OF THE INVENTION

The present invention provides a processing system for processing a wafer with a processing vapor. The processing system comprises a chamber, a wafer holder disposed within the chamber for holding the wafer, a drive mechanism for moving the wafer holder through the chamber, and a processing vapor inlet disposed within the chamber for introducing the processing vapor into the chamber and directing the processing vapor onto the wafer. The processing vapor inlet has a generally elongate cross-section configured to create a flow of processing vapor with a generally elongate cross-section and to direct the flow onto the wafer surface in an orientation generally perpendicular to the wafer surface, thus causing the formation of a generally linear stagnation zone in the flow of the processing vapor where the flow meets the wafer surface. The processing system may include a first outlet positioned toward the front of the chamber and a second outlet positioned toward the back of the chamber.

BRIEF DESCRIPTION OF THE DRAWINGS

FIG. 6 is a top sectional view of the flow shape converter of FIG. 4, taken along line 6—6 of FIG. 4.

FIG. 7 is a top sectional view of the flow shape converter of FIG. 4, taken along line 7—7 of FIG. 4.

FIG. 8 is a top sectional view of the flow shape converter of FIG. 4, taken along line 8—8 of FIG. 4.

FIG. 9 is a side sectional view of the wafer holder of the embodiment of FIG. 1.

FIG. 10 is a partially sectioned side view of input and exit locks of the embodiment of FIG. 1.

DETAILED DESCRIPTION OF THE DEPICTED EMBODIMENTS

Figure 1:
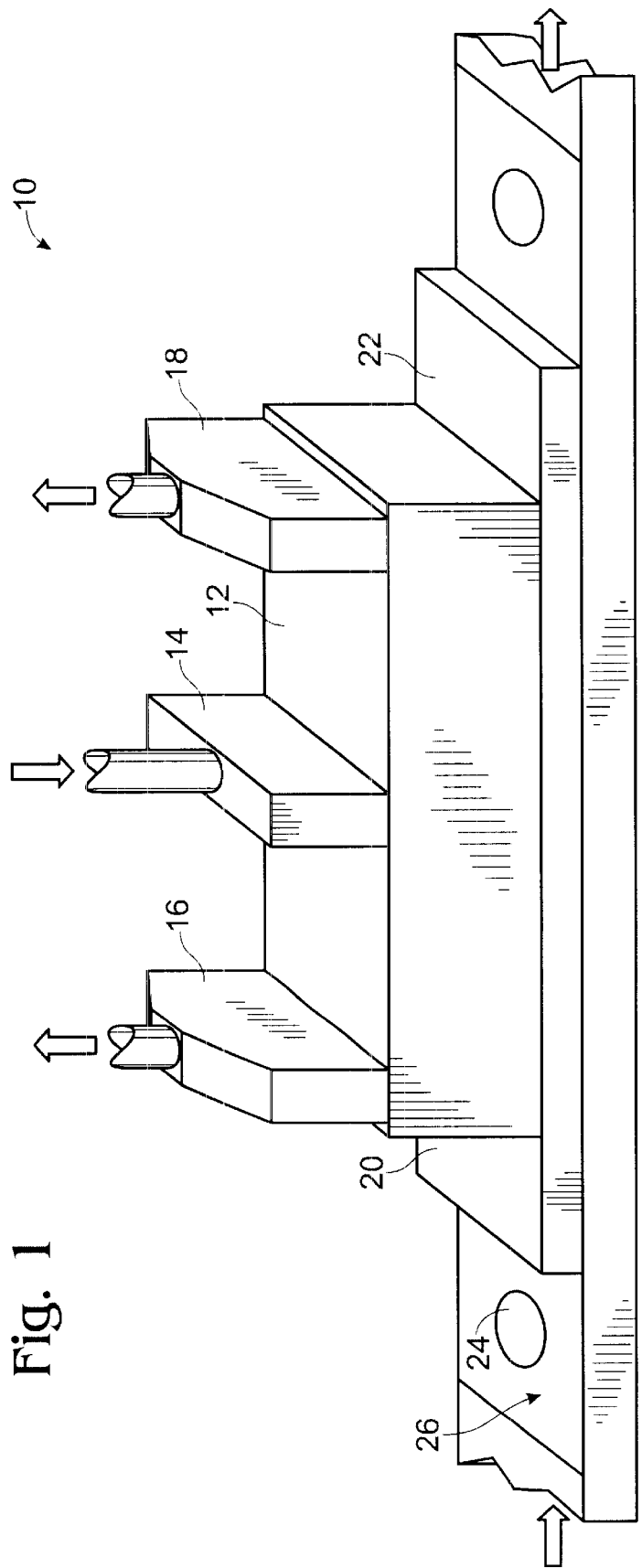
FIG. 1 is a perspective view of a first embodiment of a processing system according to the present invention.

A first embodiment of a processing system according to the present invention is shown generally at 10 in FIG. 1 as a CVD system. Processing system 10 includes a chamber 12 sealed from the outside environment in which wafer processing occurs. Processing system 10 also includes a reactant gas inlet 14, a front exhaust gas outlet 16 and a rear exhaust gas outlet 18. An input lock 20 and an exit lock 22 are provided at opposing ends of chamber 12 to allow wafers 24 to be moved into and out of the chamber without exposing the chamber to the external environment. Finally, a conveyor mechanism 26 may be used to move wafers 24 into, through and out of chamber 12.

Figure 2:
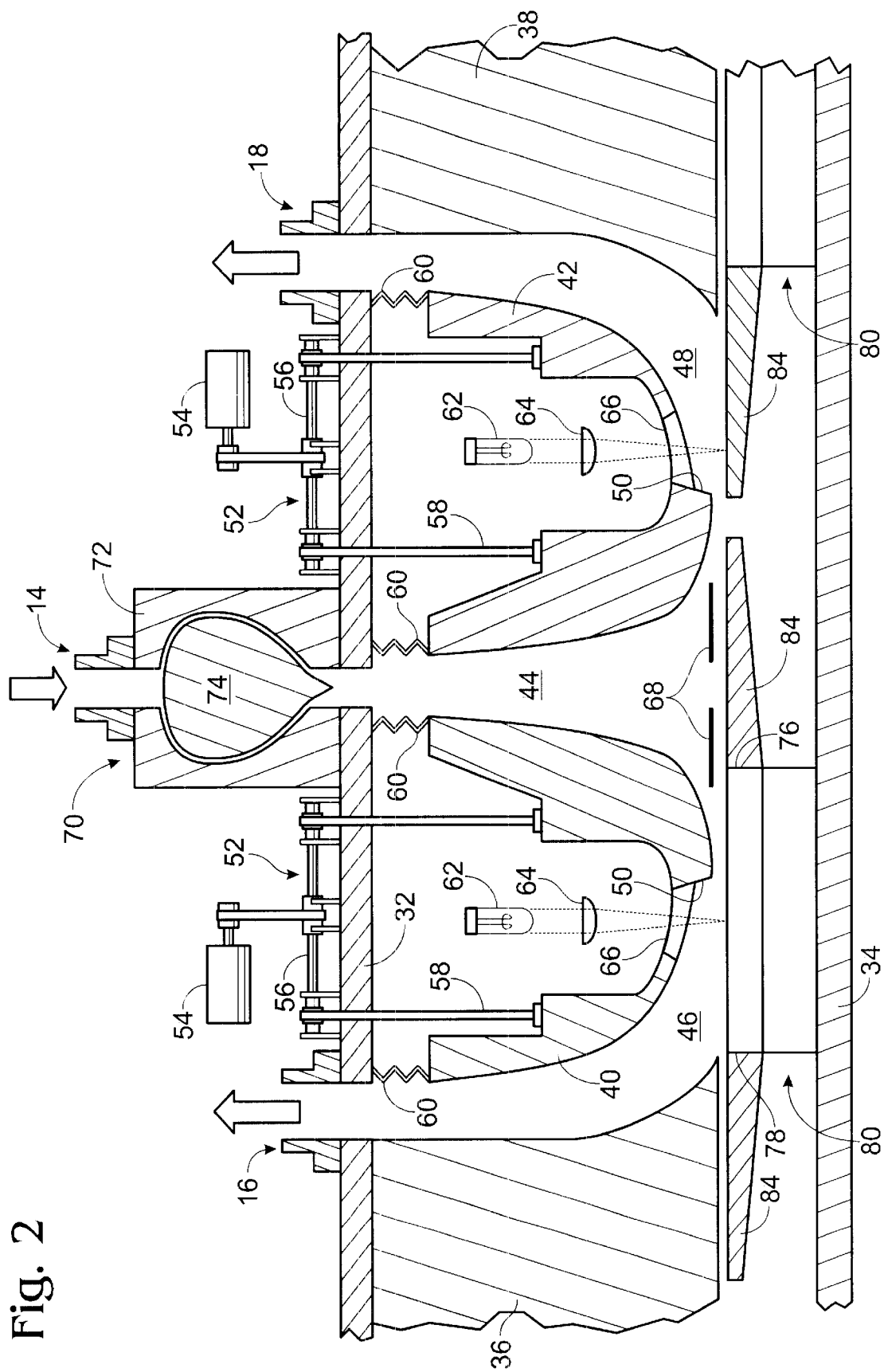
FIG. 2 is a partially sectioned side view of the chamber of the embodiment of FIG. 1.

FIG. 2 shows the interior of chamber 12 in more detail. The interior boundaries of chamber 12 are defined by a top wall 32, a bottom wall 34, a front wall 36, a back wall 38, and a pair of side walls not shown in this view. Chamber 12 also has two interior walls, front interior wall 40 and rear interior wall 42, that define the shape of the gas flow passage within chamber 12. Front interior wall 40 and rear interior wall 42 extend downwardly from top wall 32 adjacent gas inlet 14, and then curve around in opposite directions from one another to meet top wall 32 at front outlet 16 and rear outlet 18, respectively.

The portions of front interior wall 40 and rear interior wall 42 that extend downwardly from gas inlet 14 form a generally vertical inlet gas passage 44. Likewise, the portions of front interior wall 40 and rear interior wall 42 that curve away from each other define one wall of a front gas flow passage 46 and a rear gas flow passage 48, respectively. Front gas flow passage 46 leads to front exhaust gas outlet 16, and rear gas flow passage 48 leads to rear exhaust gas outlet 18. Typically, front exhaust gas outlet 16 and rear exhaust gas outlet 18 will be pumped by the same pump, so the back pressure at the two exhaust gas outlets 16 and 18 will be generally the same. Therefore, reactant gas introduced into chamber 12 via inlet 14 will split to flow in generally equal proportions along front gas flow passage 46 and rear gas flow passage 48.

Processing system 10 has several features that allow a flow of reactant gas through chamber 12 to be modified in various ways to create unique processing environments compared to known processing systems. For example, each of front gas flow passage 46 and rear gas flow passage 48 has a region in which the cross-sectional area of the gas flow passage suddenly expands. This region is defined by a step 50 formed in each of front interior wall 40 and rear interior wall 42. By pumping front outlet 16 and rear outlet 18 to a sufficiently low back pressure, a supersonic flow can be created in the regions downstream of each step 50.

Referring to FIG. 2, the cross-sectional area of each of front gas flow passage 46 and rear gas flow passage 48 converges through its length until it reaches step 50, where it suddenly expands or diverges. This allows each of gas flow passages 46 and 48 to act as a Laval nozzle. When the back pressure is pumped to a sufficiently low level, gas flow through each of gas flow passages 46 and 48 may become choked upstream of step 50. At step 50, the choked gas flow can expand into a supersonic flow. It will be appreciated that step 50 will not cause a supersonic flow to form unless the pressure at front outlet 16 and rear outlet 18 is pumped sufficiently low. Thus, chamber 12 can also be used to create entirely subsonic flows by using a higher back pressure at outlets 16 and 18.

When a supersonic flow is created, a corresponding shock wave will form a short distance downstream of step 50, where the flow again becomes subsonic. The subsonic shock wave region has much higher pressures and temperatures than the supersonic flow region, and can be used to create unique processing conditions. For example, the sudden changes in pressure found at the shock wave boundary may be used in front gas flow passage 46 to break up a boundary layer on the top of wafer 24 to create more sites on the wafer surface for CVD reactions. Similarly, the large temperature differential between the shockwave and the supersonic flow region can be used to activate a reaction in either the front gas flow passage 46 or the rear gas flow passage 48.

The pressures required to create a supersonic flow are a function of the cross-sectional area of front and rear gas flow passages 46 and 48. To allow the flow characteristics of chamber 12 to be varied, front interior wall 40 and rear interior wall 42 may be coupled to top wall 32 with an adjustment mechanism 52 that allows the interior walls to be raised or lowered relative to bottom wall 34. In this manner, raising an interior wall would require a greater pressure differential between inlet 14 and outlets 16 and 18 to create supersonic flow. Likewise, lowering an interior wall would require a lesser pressure differential to create a supersonic flow. Furthermore, the interior wall heights may be changed independently to balance the flow of vapor in front and rear gas flow passages 46 and 48.

Any suitable adjustment mechanism may be used to allow the adjustment of the heights of front and rear interior walls 40 and 42. In the depicted embodiment, each adjustment mechanism 52 includes a motor 54 for driving an axle 56 that is coupled to the corresponding interior wall via a pair of threaded rods 58, or other suitable connectors (such as belts or chains). Turning axle 56 causes threaded rods 58 to turn, which either raises or lowers the interior wall, depending upon the direction in which the axle is turned. Each end of both front interior wall 40 and rear interior wall 42 is connected to top wall 32 with an expandable/contractable bellows 60 to maintain the airtight seal of front gas flow passage 46 and rear gas flow passage 48.

The use of separate adjustment mechanisms 52 for front interior wall 40 and rear interior wall 42 allows the heights of the interior walls to be independently varied. This allows the flow velocities of front gas flow passage 46 and rear gas flow passage 48 to be independently varied, giving process system 10 much flexibility. However, front and rear interior walls 40 and 42 may also be raised and lowered with a single adjustment mechanism, or may even be unadjustably fixed to top wall 32, without departing from the scope of the present invention.

CVD reactions typically require the input of some form of energy to cause the desired reactions to take place. Thus, chamber 12 may include reaction energy sources 62. Energy sources 62 may be positioned in any desired location within chamber 12, and may be configured to supply any desired form of energy. In the depicted embodiment, energy sources 62 take the form of lamps (typically infrared lamps) disposed within front interior wall 40 and rear interior wall 42. Each lamp 62 is focused by a lens 64 through a window 66 into each of front gas flow passage 46 and rear gas flow passage 48. Other possible energy sources include resistive or inductive heating elements, or electron beams. One or more masks 67 may also be provided within chamber 12 to give more precise control to deposition processes conducted in the chamber.

Figure 3:
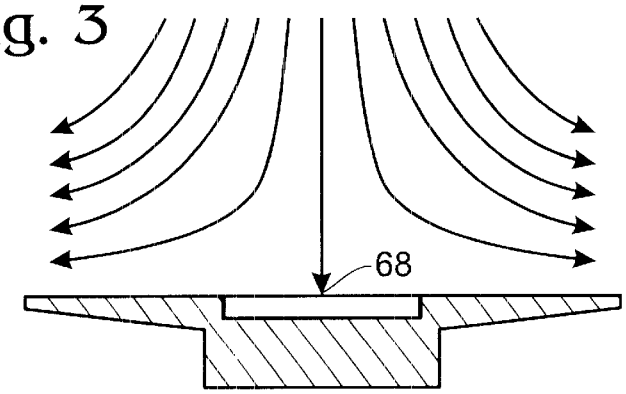
FIG. 3 is a schematic diagram of a flow of reactant gas hitting a wafer surface in the chamber of the embodiment of FIG. 1.
Figure 4:
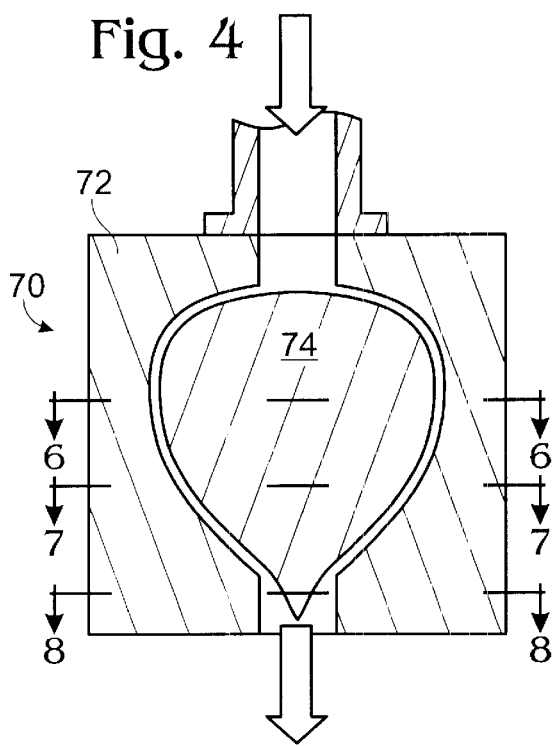
FIG. 4 is a side sectional view of a flow shape converter of the embodiment of FIG. 1.
Figure 5:
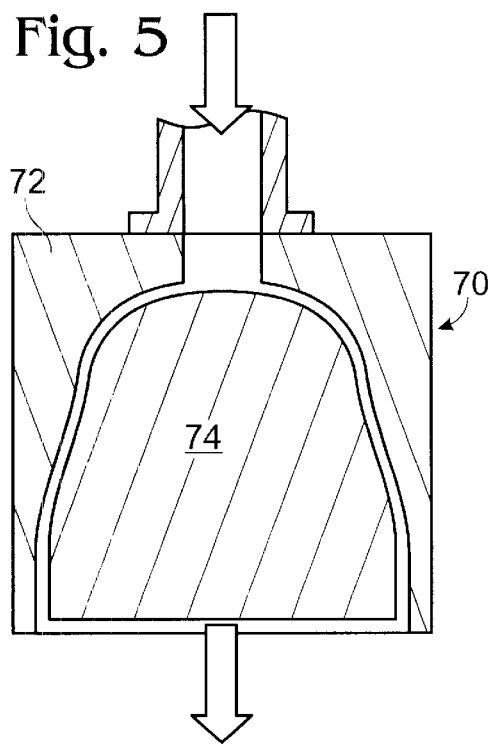
FIG. 5 is a front sectional view of the flow shape converter of FIG. 4.

Another advantage of processing system 10 is found in its reactant gas inlet 12. Inlet 12 is configured to introduce a flow of gas with a long, narrow cross-section into vertical inlet gas passage 44. The long dimension of the gas flow cross-section is oriented perpendicular to the direction of wafer travel in chamber 12, and extends completely across the width of wafer 24. This causes a stagnation point to form in the reactant gas flow where the flow meets the surface of wafer 24, as shown at 68 in FIG. 3.

When a flow of gas impinges perpendicularly upon a flat object, a stagnation region is formed in the center of the flow. In the stagnation region, the velocity of the flow is zero, and the pressure is higher than the pressure in the surrounding flow. Flows on either side of the stagnation region take on the form of near hyperbolic curves as they deflect to the sides. In the context of the present invention, as wafer 24 moves beneath inlet 14, it moves directly underneath the elongate gas flow. As a result, an elongate stagnation region is formed on the wafer surface, which sweeps across the entire wafer. In this manner, the entire wafer is exposed to a flow of reactant gas with a generally consistent concentration of reactants, causing the growth of an even layer with little to no depletion effects.

Inlet 12 may have any suitable configuration for giving the reactant gas mixture flow an elongate cross-section. In the depicted embodiment, inlet 12 includes a flow shape converter 70 for smoothly achieving this transition with the introduction of minimal turbulence. Flow shape converter 70 includes an outer wall 72 and an inner flow diverter 74 around which the reactant gas mixture must flow to reach the interior of chamber 12.

FIGS. 4–8 show flow shape converter 70 in more detail. First, referring to FIGS. 4–6, it can be seen that flow diverter 74 has a generally spherical shape at its top, where the incoming flow of the reactant gas mixture impinges on the flow diverter. Outer wall 72 tapers outwardly in this region to accommodate the shape of flow diverter 74. The shape of flow diverter 74 changes smoothly from spherical to elongate from its top end to its bottom end. This is best seen in FIGS. 7 and 8. At its bottom end, flow diverter 74 has a fairly sharp edge, allowing the gas flow around it to come smoothly together. Thus, as the reactant gas flow leaves flow shape converter 70, it has an elongate cross-sectional shape. If desired, an energy source such as a heating element or microwave source may be positioned at the exit to (or other location within) flow shape converter 70 to initiate any desired pre-deposition chemical reactions in the reactant gas mixture. Throughout its change in shape, the cross-sectional area of the space between outer wall 72 and flow diverter 74 maintains a generally constant perimeter.

The spacing between outer wall 72 and flow diverter 74 in flow shape converter 70 is such that the overall cross-sectional area of any slice of the space between the outer wall and flow diverter in a direction perpendicular to the overall gas flow is generally constant. This prevents the incoming gas from changing velocity, and thus helps to prevent the formation of turbulence in the gas flow.

The use of front gas flow passage 46 and rear gas flow passage 48 in chamber 12 adds another measure of protection against depletion effects. Generally, some film growth occurs in front gas flow passage 46 and rear gas flow passage 48, especially in subsonic flow conditions. As wafer 24 moves through front gas flow passage 46, reactant gas flows from the leading edge 76 of the wafer to the lagging edge 78 of the wafer. The resulting film may be thicker adjacent leading edge 76 than adjacent to lagging edge 78. However, as wafer 24 next moves through rear gas flow passage 48, the reactant gas flows from lagging edge 76 of the wafer to leading edge 78. This may cause the resulting film to grow more quickly adjacent lagging edge 76 than leading edge 78, thus compensating for any variations in thickness that were caused by front gas flow passage 46.

Processing system 10 may have any suitable conveyor mechanism for moving wafers 24 through chamber 12. In the depicted embodiment, each wafer 24 is carried on a wafer holder 80, which is in turn coupled to a suitable conveyor mechanism. An example of a suitable wafer holder 80 is shown in more detail in FIG. 9. Wafer holder 80 includes a central recessed portion 82. Central recessed portion 82 is configured to prevent wafer 24 from falling off wafer holder 80 during processing. Typically, central recessed portion will have a similar circumference to wafer 24 and a depth approximately equal in magnitude to the thickness of the wafer so that the flow of the reactant gas mixture over the wafer is disturbed to the smallest possible extent. Wafer holder 80 may also include one or more outwardly extending wing portions 84 to help further smooth the flow of gas over wafer 24. Wafer holders 80 are preferably positioned closely enough to one another so that wing portions 84 almost meet to create a continuous floor in the processing chamber, as shown in FIG. 2. Small breaks between adjacent wafer holders 80 allow for the operation of input lock 20 and exit lock 22, as described in more detail below.

Similarly, any desired drive mechanism may be used to drive wafer holders 80 through chamber 12. An example of a suitable drive mechanism is the use of linear motors to drive wafer holders 80 along rails.

Wafer holder 80 will typically have a wafer securing mechanism to ensure that the wafer does not shift positions during processing. Any suitable securing mechanism may be used. In the depicted embodiment, wafer holder 80 includes an electrostatic securing mechanism 86. Other suitable securing mechanisms, such as a vacuum chuck, may also be used. Furthermore, wafer holder 86 may have one or more lifting pins 88 (two are shown) to help remove wafer 24 from wafer holder 80 after processing has been completed. Wafer holder 80 may also have any other desired features, such as heating elements to maintain wafer 24 at an even temperature throughout processing, and a rotary motor to turn the wafer during processing.

Input lock 20 and exit lock 22 allow wafers 24 to be inserted into and removed from chamber 12 without exposing chamber 12 to the outside atmosphere. Typically, input and exit locks 20 and 22 each include an exterior door 90 and an interior door 92 that are operated via any suitable mechanism, such as hydraulic cylinders 94. Exterior doors 90 and interior doors 92 are sufficiently narrow to fit between adjacent wafer holders 80. Input lock 20 may also include heating elements 96 to heat wafer 24 to deposition temperature before the wafer enters chamber 12, and exit lock 22 may include cooling elements 98 to cool wafer 24 before removing it from chamber 12.

Input lock 20 is operated as follows. First, exterior door 90 is opened, and wafer 24 is moved into the interior of input lock 20 on wafer holder 80. Next, the interior of input lock 20 is pumped down with a vacuum pump (not shown) to remove atmospheric gases. After pumpdown, the interior of input lock 20 is backfilled with the same gas mixture that is being used in chamber 12 for the deposition. Alternatively, the interior of input lock 20 may be backfilled with an inert gas, or any other suitable gas mixture. Finally, interior door 92 is opened and wafer 24 is moved into chamber 12. The pumpdown and backfilling steps may be repeated multiple times if desired.

Exit lock 22 operates in a similar fashion. First, interior door 90 is opened, and wafer 24 is moved into the interior of exit lock 22. Next, reactant gases are removed via a pump (not shown), and the interior of exit lock 22 is backfilled with whatever gas the wafer will encounter in the next processing stage. Multiple pumpdown and backfilling stages may be used if desired. Once the interior of exit lock 22 has been purged of all reactant gas mixture, exterior door 90 is opened and wafer 24 is moved out of the interior of the exit lock.

Figure 11:
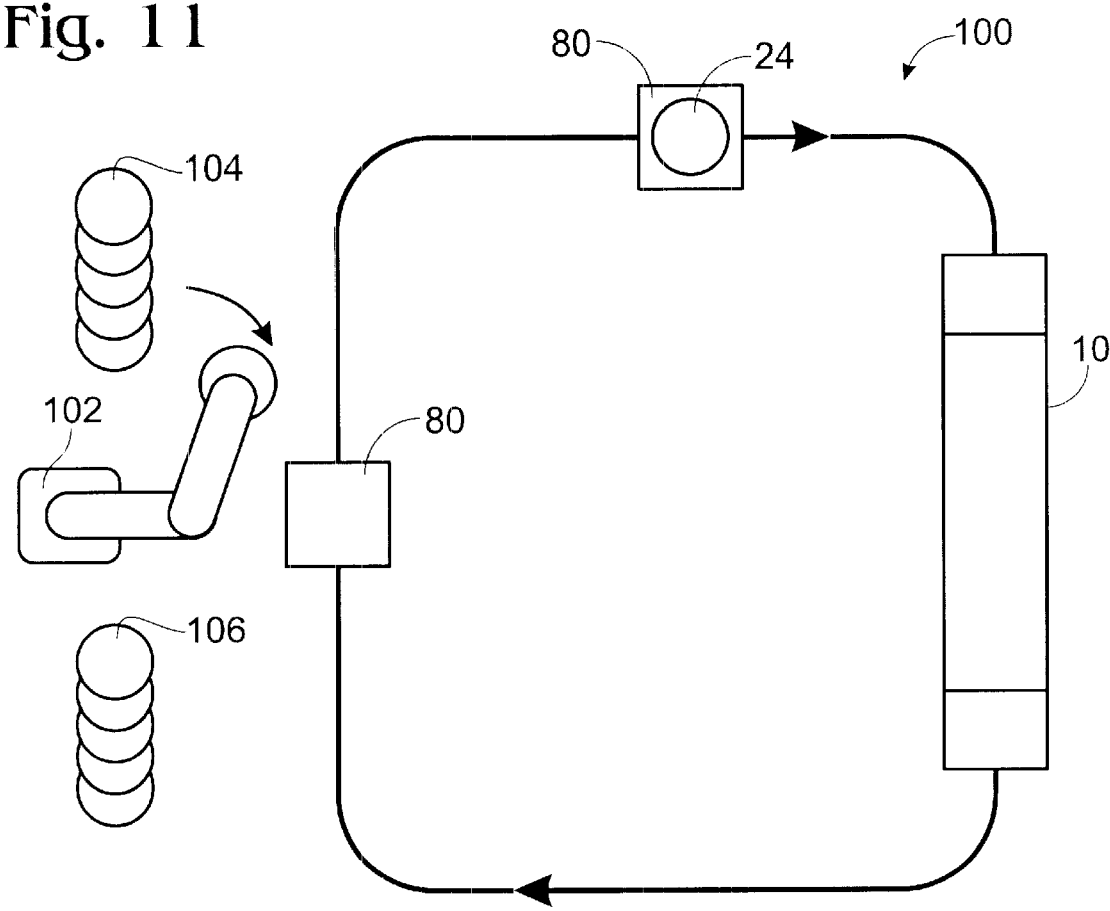
FIG. 11 is a schematic diagram of a wafer processing line that includes the wafer processing system of FIG. 1.

Processing system 10 will typically be used on an automated continuous process line. A schematic diagram of an exemplary process line is shown generally at 100 in FIG. 11. Process line 100 includes a wafer input queue 102, where wafers 24 await processing. A robotic arm 104 moves an individual wafer 24 onto a wafer holder 80, which carries the wafer to processing system 10. After processing, wafer 24 is carried back to robotic arm 104, which removes wafer 24 from wafer carrier 90 and places the wafer in an output queue 106, where the wafer awaits the next processing stage. Often, other processing machines may be integrated into the same process line as processing system 10. Furthermore, to increase throughput, more than one processing system 10 may be operated in parallel on a single processing line.

Figure 12:
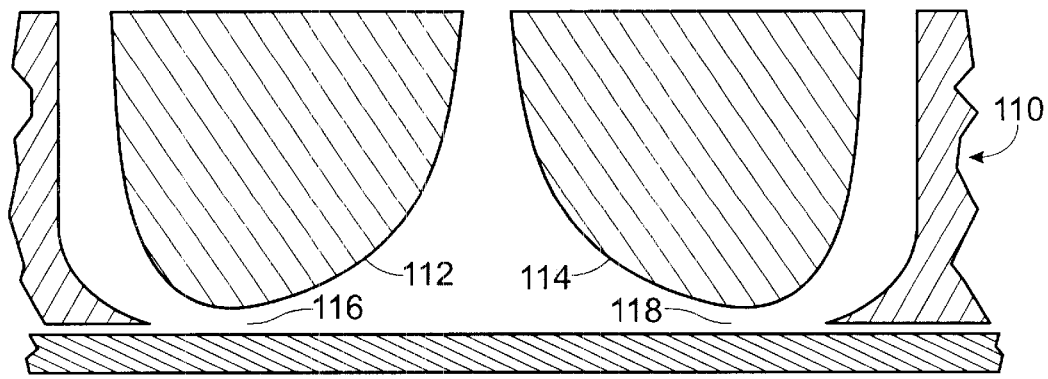
FIG. 12 is a somewhat simplified side sectional view of a second embodiment of a processing system according to the present invention.

FIG. 12 shows generally at 110 a simplified view of a second embodiment of a processing system chamber according to the present invention. Processing system chamber 110 has a very similar construction as processing chamber 12, and includes a front interior wall 112 defining a front gas flow passage 116 and a rear interior wall 114 defining a rear gas flow passage 118, respectively. Unlike processing chamber 12, however, interior walls 112 and 114 of processing chamber 110 do not have a step 50 that creates a sudden increase in the cross-sectional areas of front and rear gas flow passages 116 and 118. Thus, processing chamber 110 is not configured to cause supersonic gas flows. However, processing system 110 still offers the advantages of the formation of the reaction gas stagnation region on the wafer surface, and also the advantages in film uniformity offered by the opposing gas flow directions of front gas flow passage 116 and rear gas flow passage 118.

Figure 13:
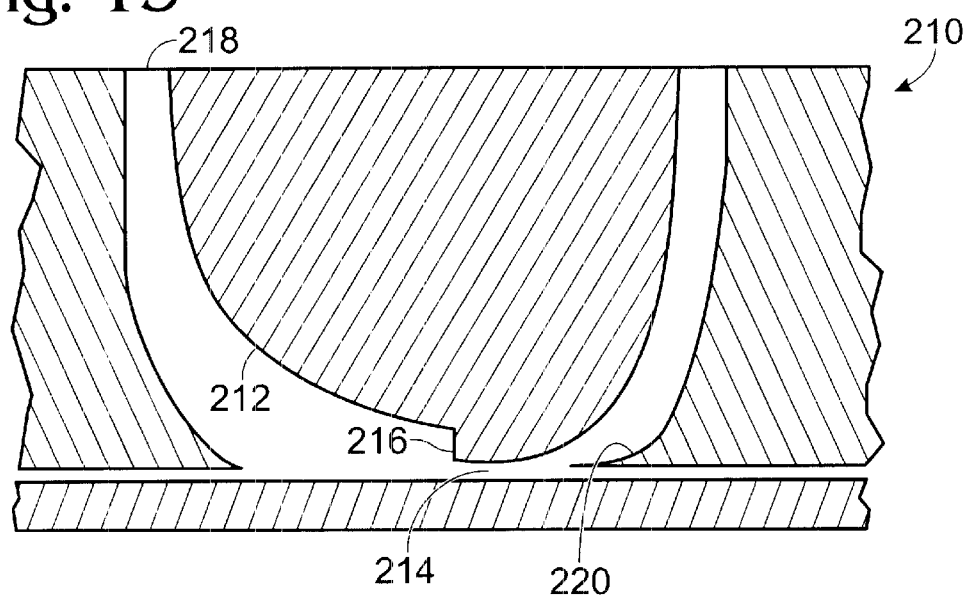
FIG. 13 is a somewhat simplified side sectional view of a third embodiment of a processing system according to the present invention.

FIG. 13 shows generally at 210 a third embodiment of a processing chamber according to the present invention. Like processing chamber 12, processing chamber 210 includes an interior wall 212 that defines a gas flow passage 214 within chamber 210. Also, interior wall 212 includes a step 216 that defines a region of gas flow passage 214 with a sudden increase in cross-sectional area. However, unlike processing chamber 12, processing chamber 210 has only a single gas outlet 218. Thus, processing chamber 210 is configured to create supersonic gas flows, but does not offer the advantages of the opposing gas flow directions of front gas flow passage 46 and rear gas flow passage 48 of chamber 12. Processing chamber 210 also may include a deflector 220 that causes the reactant gas mix to smoothly change directions in the chamber. Deflector 220 prevents the reactant gas mix from flowing directly downward onto the wafer, and thus prevents the formation of a stagnation region on surface of wafer 24, but also may prevent vortices from forming in the flow of the reactant gas mix and thus may improve the overall performance of processing chamber 210.

Figure 14:
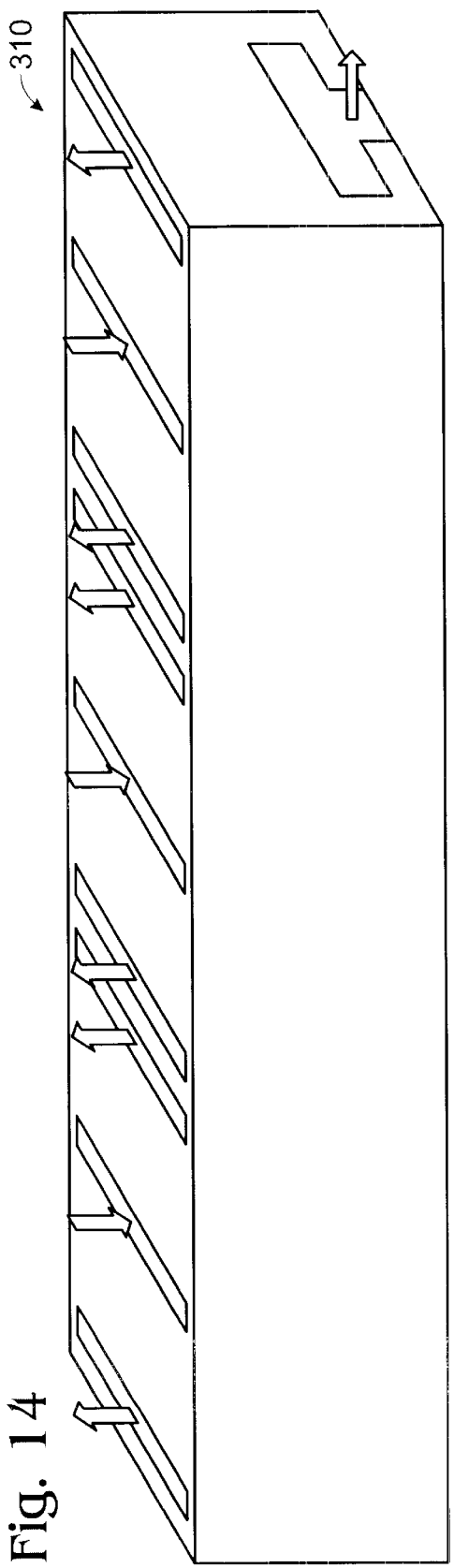
FIG. 14 is a perspective view of a fourth embodiment of a processing system according to the present invention.
Figure 15:
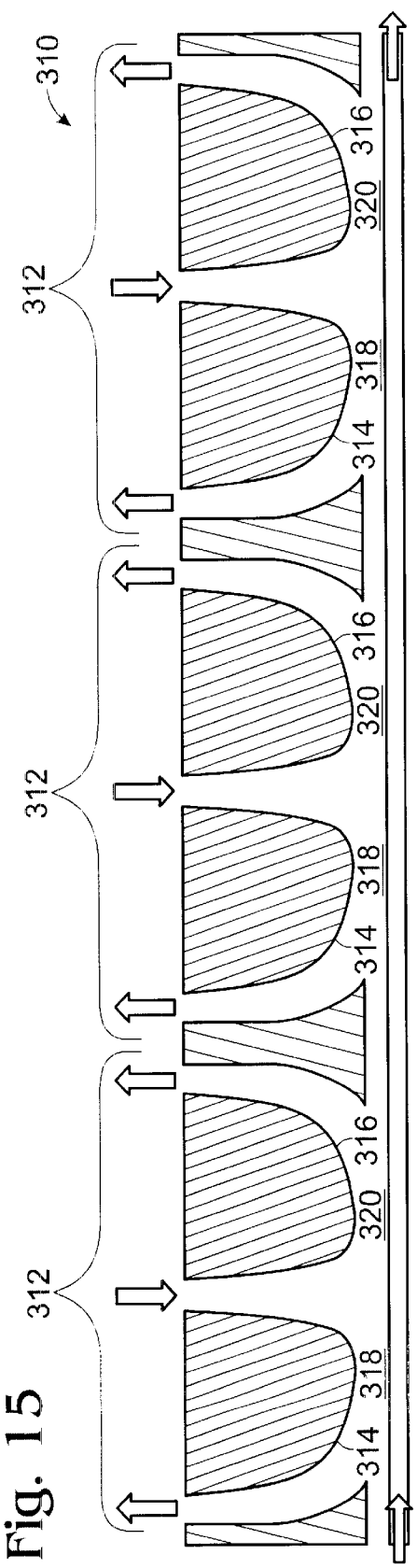
FIG. 15 is a somewhat simplified, side sectional view of the embodiment of FIG. 14.

When wafers must be run through a number of sequential processing stages, the required purging and pumpdown steps needed at each load lock or processing chamber can greatly increase the amount of time needed to process the wafers. To increase the efficiency of multistep processes, a plurality of processing chambers according to the present invention may be integrated into a single body or frame. An example of a multichamber processor is shown generally at 310 in FIGS. 14–15. Multichamber processor 310 includes three individual processing chambers 312. Each individual processing chamber 312 has front and rear interior walls 314 and 316, defining front and rear gas flow passages 318 and 320 respectively, for each chamber. Front and rear interior walls 314 and 316 may have a smooth contour, as shown in FIG. 15, or may have a step to allow for the possibility of supersonic processing. If each individual chamber 312 is used to deposit sequential layers of the same compound, then the individual chambers may be directly connected, without the use of any load locks between the chambers. Likewise, if the individual chambers 312 are used to deposit layers of different materials, then the stages may be separated by load locks, and a pumpdown/purging routine may be performed between each section.

While the depicted multistage processing chamber has three individual processing stages, it will be appreciated that it may have either fewer or more stages if desired. Furthermore, while each of the embodiments disclosed above is a CVD system, it will be appreciated that a processing chamber according to the present invention may be used with any other suitable type of vapor phase processing device.

The disclosure set forth above encompasses multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious and directed to one of the inventions. These claims may refer to "an" element or "a first" element or the equivalent thereof; such claims should be understood to include incorporation of one or more such elements, neither requiring nor excluding two or more such elements. Inventions embodied in other combinations and subcombinations of features, functions, elements, and/or properties may be claimed through amendment of the present claims or through presentation of new claims in this or a related application. Such claims, whether directed to a different invention or to the same invention, and whether broader, narrower, equal, or different in scope to the original claims, also are regarded as included within the subject matter of the inventions of the present disclosure.

I claim:

1. A processing system for processing a wafer with a processing vapor, the wafer having a surface, the processing system comprising:

a chamber;

a wafer holder disposed within the chamber for holding the wafer;

a drive mechanism for moving the wafer holder through the chamber;

a processing vapor inlet disposed within the chamber for introducing the processing vapor into the chamber and directing the processing vapor onto the wafer; and a vapor flow passage disposed in the chamber through which the processing vapor flows, wherein the vapor flow passage has a region in which the processing vapor flows generally parallel to the surface of the wafer, and wherein the region in which the vapor flows generally parallel to the surface of the wafer includes a cross-sectional area having a step defining a sudden expansion configured to create a supersonic vapor flow in a direction generally parallel to the surface of the wafer.

2. The processing system of claim 1, the chamber having a central portion, a front and a back, wherein the processing vapor inlet is positioned in the central portion of the chamber, and wherein processing vapor flows from the processing vapor inlet and splits to flow toward a first outlet positioned toward the front of the chamber and a second outlet positioned toward the back of the chamber.

3. The processing system of claim 1, wherein the region in which the processing vapor flows generally parallel to the surface of the wafer is a first region of the vapor flow passage, and wherein the vapor flow passage has a second region in which the processing vapor flows in a direction generally perpendicular to the surface of the wafer.

4. The processing system of claim 3, wherein the second region is downstream of the first region.

5. The processing system of claim 3, wherein the second region is downstream of the first region.

6. The processing system of claim 1, the chamber having an outflow configured to be connected to a vacuum pump, wherein the step in the cross-sectional area of the vapor flow passage causes a supersonic flow of processing vapor downstream of the step to decelerate forming a shock wave when the outflow is pumped to a sufficiently low pressure by the vacuum pump.

7. The processing system of claim 1, wherein the processing vapor inlet has a generally elongate cross-section configured to create a flow of processing vapor with a generally elongate cross-section and to direct the flow onto the wafer surface in an orientation generally perpendicular to the wafer surface, thus causing the formation of a generally linear stagnation zone in the flow of the processing vapor where the flow meets the wafer surface.

8. A processing system for processing a wafer with a processing vapor, the wafer having a surface, the processing system comprising:
   a chamber;
   a wafer holder disposed within the chamber for holding the wafer during processing;
   a processing vapor inlet for introducing the processing vapor into the chamber, the processing vapor inlet having a generally elongate cross-section to generate a flow of processing vapor having generally elongate cross-section and being oriented to cause the processing vapor to impinge the wafer surface at a generally perpendicular angle; and
   a vapor flow passage, the vapor flow passage having a cross-sectional profile that includes a step defining a sudden expansion along a direction parallel to the wafer surface configured to create a shock wave impinging on the wafer surface generally perpendicular to a direction of wafer travel wit flow continuing generally parallel to the wafer surface, wherein the wafer and the flow of processing vapor can be moved relative to one another to cause the flow of processing vapor and shock wave to sweep across the surface of the wafer.

9. A processing system for processing a wafer with a processing vapor, comprising:
   a chamber having an exterior body and an interior vapor flow passage with a plurality of walls defining a converging region and a diverging region;
   a wafer holder disposed within the chamber and configured to hold a wafer within the vapor flow passage for processing;
   a processing vapor inlet disposed within the chamber for introducing the processing vapor into the vapor flow passage; and
   a processing vapor outlet disposed within the chamber for removing reaction products and unreacted processing vapor from the chamber, the processing vapor outlet configured to be connected to a vacuum pump for creating a lowered pressure in the processing vapor outlet,
   wherein at least one of the plurality of walls includes a step positioned in the diverging region configured to cause the vapor to flow at supersonic velocities in a direction generally parallel to a front surface of the wafer along at least part of the diverging region when the pressure in the processing vapor outlet is lowered sufficiently.

10. The processing system of claim 9, further comprising a drive mechanism configured to move the wafer holder through the chamber and along at least part of the vapor flow passage.

11. The processing system of claim 10, wherein the diverging region includes a step formed in one of the top wall and the bottom wall.

12. The processing system of claim 10, the chamber having a front portion, a back portion, and a central portion and the processing vapor outlet including a first outlet in the front portion of the chamber and a second outlet in the back portion of the chamber, wherein the processing vapor inlet is disposed within the central portion of the chamber, and wherein the vapor flow passage first extends vertically downward from the processing vapor inlet and then splits to form two generally horizontal regions extending in opposite directions toward the first outlet and the second outlet.

13. The processing system of claim 12, wherein both horizontal regions have converging regions and diverging regions configured to cause the vapor to flow at supersonic velocities in a direction generally parallel to the wafer surface being processed such that the wafer moves through a first supersonic region, then at subsonic flow velocities beneath the processing vapor inlet, and then through a second supersonic region.

14. The processing system of claim 9, the vapor flow passage having a width, wherein the top wall is movable along a vertical axis relative to the bottom wall to adjust the width of the vapor flow passage.

15. A processing system for processing a wafer with a processing vapor, comprising:
   a chamber having an exterior body and an interior vapor flow passage with a plurality of walls;
   a wafer holder disposed within the chamber and configured to hold a wafer within the vapor flow passage for processing;
   a processing vapor inlet disposed within the chamber for introducing the processing vapor into the vapor flow passage; and
   a processing vapor outlet disposed within the chamber for removing reaction products and unreacted processing vapor from the chamber, the processing vapor outlet configured to be connected to a vacuum pump for creating a lowered pressure in the processing vapor outlet,
   wherein at least one of the plurality of walls includes a region in which the wall first converges and then diverges with respect to at least one other of the plurality of walls along the vapor flow passage to cause the vapor to flow at supersonic velocities along at least part of the diverging region when the pressure in the processing vapor outlet is lowered sufficiently, and wherein a top wall is movable along a vertical axis relative to a bottom wall to adjust the width of the vapor flow passage.

16. The processing system of claim 15, wherein the top wall of the vapor flow passage is connected to the exterior body of the chamber with a mechanical adjustment mechanism.

17. The processing system of claim 15, the chamber having a top wall and an interior wall forming the upper wall of the vapor flow passage, wherein the vapor flow passage is coupled to the top wall with an expandable bellows.

18. A processing system for processing a wafer with a processing vapor, the wafer having a surface, the processing system comprising:
   a chamber having an exterior body and an interior vapor flow passage, the vapor flow passage having a cross-sectional profile with a step defining a sudden expansion configured to create a shock wave in the vapor flow passage;
   a wafer holder disposed in the chamber and configured to hold the wafer within the interior vapor flow passage for processing;
   a drive mechanism configured to drive the wafer holder through the chamber along at least a part of the interior vapor flow passage; and
   a processing vapor inlet for introducing a flow of processing vapor into the chamber,
   wherein the vapor flow passage directs the processing vapor onto the wafer at a generally perpendicular angle to the wafer surface when the wafer is in a first region of the vapor flow passage, and
   wherein the shock wave is in a second region of the vapor flow passage downstream of the first region.

19. The processing system of claim 18, the chamber having a front portion, a back portion, and a central portion, wherein the processing vapor inlet is disposed within the central portion of the chamber, and wherein the vapor flow passage extends from the processing vapor inlet and splits to direct flow toward a first outlet in the front portion of the chamber and a second outlet in the back portion of the chamber.

20. The processing system of claim 18, wherein the processing vapor inlet has an elongate cross-section to give the flow of processing vapor an elongate cross-section.

21. A processing system for processing a wafer with a processing vapor, comprising:
   a chamber having an exterior body and an interior vapor flow passage, the interior vapor flow passage having a generally vertically oriented region and a generally horizontally oriented region located downstream of the generally vertically oriented region, the generally horizontally oriented region including an upstream converging region and a downstream diverging region, the downstream diverging region including a step;
   a wafer holder disposed within the chamber and configured to hold a wafer within the vapor flow passage for processing and to be moved through the vapor flow passage by a drive mechanism;
   a processing vapor inlet for introducing the processing vapor into the generally vertically oriented region of the vapor flow passage; and
   a processing vapor outlet configured to be connected to a vacuum pump for removing waste from the chamber and for lowering gas pressure in the processing vapor outlet sufficiently to create a supersonic flow of processing vapor downstream of the step within the diverging region.

22. A processing system for processing a wafer with a processing vapor, the wafer having a surface, the processing system comprising:
   a chamber;
   a wafer holder disposed within the chamber for holding the wafer;
   a drive mechanism for moving the wafer holder through the chamber; and
   a processing vapor inlet disposed within the chamber for introducing the processing vapor into the chamber and directing the processing vapor onto the wafer,
   wherein the processing vapor inlet has a generally elongate cross-section configured to create a flow of processing vapor with a generally elongate cross-section and to direct the flow onto the wafer surface in an orientation generally perpendicular to the wafer surface, thus causing the formation of a generally linear stagnation zone in the flow of the processing vapor where the flow meets the wafer surface, and wherein the processing vapor inlet includes a flow shape converter configured to convert a flow of processing vapor with a generally round cross-section to the flow with the generally elongate cross-section.

23. The processing system of claim 22, wherein the flow shape converter includes a centrally disposed flow diverter around which the processing vapor flows to reach the chamber.

24. The processing system of claim 23, the processing vapor flow having a direction, wherein the flow diverter has a cross-section that is initially round and becomes increasingly elongate along the direction of processing vapor flow.

25. The processing system of claim 24, wherein the cross-section of the flow diverter has a constant perimeter.

26. A processing system for processing a wafer with a processing vapor, comprising:
   a chamber having an exterior body and an interior vapor flow passage with a plurality of walls;
   a wafer holder disposed within the chamber and configured to hold a wafer within the vapor flow passage for processing;
   a processing vapor inlet disposed within the chamber for introducing the processing vapor into the vapor flow passage;
   a processing vapor outlet disposed within the chamber for removing reaction products and unreacted processing vapor from the chamber, the processing vapor outlet configured to be connected to a vacuum pump for creating a lowered pressure in the processing vapor outlet; and
   a drive mechanism configured to move the wafer holder through the chamber and along at least part of the vapor flow passage,
   wherein at least one of the plurality of walls includes a region in which the wall first converges and then diverges with respect to at least one other of the plurality of walls along the vapor flow passage to cause the vapor to flow at supersonic velocities along at least pan of the diverging region when the pressure in the processing vapor outlet is lowered sufficiently, and wherein the diverging region includes a step formed in one of the top wall and the bottom wall.

27. A processing system for processing a wafer with a processing vapor, comprising:
- a chamber having an exterior body and an interior vapor flow passage with a plurality of walls;
- a wafer holder disposed within the chamber and configured to hold a wafer within the vapor flow passage for processing;
- a processing vapor inlet disposed within the chamber for introducing the processing vapor into the vapor flow passage;
- a drive mechanism configured to move the wafer holder through the chamber and along at least part of the vapor flow passage; and
- a processing vapor outlet disposed within the chamber for removing reaction products and unreacted processing vapor from the chamber, the processing vapor outlet configured to be connected to a vacuum pump for creating a lowered pressure in the processing vapor outlet, wherein at least one of the plurality of walls includes a step at the diverging region configured to cause the vapor to flow at supersonic velocities along at least part of the diverging region when the pressure in the processing vapor outlet is lowered sufficiently, and wherein the driving mechanism moves the wafer holder through the converging region and the diverging region, thereby exposing the wafer to bat subsonic flows and supersonic flaws of processing vapor.

* * * * *